(12) United States Patent
Murakami et al.

(10) Patent No.: US 9,660,132 B2
(45) Date of Patent: May 23, 2017

(54) METHOD OF MANUFACTURING SOLAR CELL

(71) Applicant: SANYO Electric Co., Ltd., Osaka (JP)

(72) Inventors: Youhei Murakami, Osaka (JP); Daisuke Ide, Osaka (JP); Mitsuaki Morigami, Osaka (JP); Ryo Goto, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 360 days.

(21) Appl. No.: 14/623,736

(22) Filed: Feb. 17, 2015

(65) Prior Publication Data

US 2015/0162488 A1 Jun. 11, 2015

Related U.S. Application Data

(60) Continuation of application No. PCT/JP2011/068543, filed on Aug. 16, 2011, and a
(Continued)

(30) Foreign Application Priority Data

Aug. 24, 2010 (JP) ................. 2010-187407

(51) Int. Cl.
*H01L 31/20* (2006.01)
*H01L 31/0475* (2014.01)
(Continued)

(52) U.S. Cl.
CPC ........ *H01L 31/20* (2013.01); *H01L 31/02008* (2013.01); *H01L 31/02167* (2013.01); *H01L 31/022425* (2013.01); *H01L 31/022441* (2013.01); *H01L 31/022458* (2013.01); *H01L 31/042* (2013.01); *H01L 31/046* (2014.12); *H01L 31/0465* (2014.12);
(Continued)

(58) Field of Classification Search
CPC ......... H01L 31/022441; H01L 31/0682; H01L 31/0516; H01L 31/02008; H01L 31/022425; H01L 31/046; H01L 31/0465; H01L 31/0475; H01L 31/042; H01L 31/0504; H01L 31/20; H01L 31/02167; H01L 31/022458
See application file for complete search history.

(56) References Cited

U.S. PATENT DOCUMENTS 3,177,576 A * 4/1965 Kuzminski ............. H01L 31/18
136/259
5,130,775 A * 7/1992 Maeda ............. H01L 31/02243
136/256
(Continued)

*Primary Examiner* — Bac Au
(74) *Attorney, Agent, or Firm* — Mots Law, PLLC

(57) ABSTRACT

A solar cell includes a solar cell substrate including a principal surface on which a p-type surface and an n-type surface are exposed, a p-side electrode formed on the p-type surface and including a first linear portion linearly extending in a first direction, and an n-side electrode formed on the n-type surface and including a second linear portion linearly extending in the first direction and arranged next to the first linear portion in a second direction orthogonal to the first direction. Corners of a tip end of at least one of the first and second linear portions are formed in a chamfered shape.

5 Claims, 7 Drawing Sheets

Related U.S. Application Data division of application No. 13/772,596, filed on Feb. 21, 2013, now abandoned.

(51) Int. Cl.

| | | |
|---|---|---|
| H01L 31/0224 | (2006.01) | |
| H01L 31/068 | (2012.01) | |
| H01L 31/05 | (2014.01) | |
| H01L 31/042 | (2014.01) | |
| H01L 31/0216 | (2014.01) | |
| H01L 31/0465 | (2014.01) | |
| H01L 31/02 | (2006.01) | |
| H01L 31/046 | (2014.01) | |

(52) U.S. Cl.
CPC ...... H01L 31/0475 (2014.12); H01L 31/0504 (2013.01); H01L 31/0516 (2013.01); H01L 31/0682 (2013.01)

(56) References Cited

U.S. PATENT DOCUMENTS

| | | | | |
|---|---|---|---|---|
| 8,865,510 | B2* | 10/2014 | Takahama | H01L 31/02244 |
| | | | | 438/71 |
| 8,993,875 | B2* | 3/2015 | Funakoshi | B32B 17/10018 |
| | | | | 136/244 |
| 2010/0154876 | A1* | 6/2010 | Camalleri | H01L 31/182 |
| | | | | 136/255 |
| 2010/0275990 | A1* | 11/2010 | Shimomura | H01L 31/02242 |
| | | | | 136/256 |
| 2011/0272006 | A1* | 11/2011 | Sainoo | H01L 31/048 |
| | | | | 136/251 |
| 2013/0087192 | A1* | 4/2013 | Kim | H01L 31/02244 |
| | | | | 136/256 |
| 2013/0153023 | A1* | 6/2013 | Mori | H01L 31/02244 |
| | | | | 136/256 |
| 2013/0298988 | A1* | 11/2013 | Fukuda | H01L 31/0516 |
| | | | | 136/256 |

* cited by examiner

METHOD OF MANUFACTURING SOLAR CELL

CROSS REFERENCE TO RELATED APPLICATIONS

This application is a continuing application of application Ser. No. 13/772,596, filed on Feb. 21, 2013, which is a continuation application of International Application No. PCT/JP2011/068543, filed on Aug. 16, 2011, entitled "SOLAR CELL AND METHOD OF MANUFACTURING THE SAME", which claims priority based on Article 8 of Patent Cooperation Treaty from prior Japanese Patent Applications No. 2010-187407, filed on Aug. 24, 2010, the entire contents of which are incorporated herein by reference.

BACKGROUND OF THE INVENTION

1. Field of the Invention

This disclosure relates to a back contact solar cell and a method of manufacturing the same.

2. Description of the Related Art

Recently, solar cells have been drawing much attention as an energy source placing only a small load on the environment. For this reason, more and more research and development has been undertaken on solar cells. In particular, an important issue is how to improve conversion efficiency of solar cells. Hence, the research and development has been made especially actively for solar cells having improved conversion efficiency and methods of manufacturing such solar cells.

As a solar cell with high conversion efficiency, Document 1 (Japanese Patent Application Publication No. 2009-200267), for example, proposes a so-called back contact solar cell with a p-type region and an n-type region formed on a back surface side of the solar cell. In this back contact solar cell, electrodes for collecting carriers do not necessarily need to be provided on a light-receiving surface. Accordingly, light-reception efficiency can be improved in a back contact solar cell, whereby improved conversion efficiency can be achieved.

Note that the solar cell described in Document 1 has a comb-teeth shaped electrode formed on each of the p-type region and on the n-type region. In Document 1, as methods of forming the electrodes, a method of applying a conductive paste and a sputtering method are described.

SUMMARY OF THE INVENTION

As the method of forming the electrodes, a plating method can be used as an option other than the method using the conductive paste or the sputtering method as described above. However, when the electrodes are formed in the plating method, there is a problem that it is difficult to sufficiently improve conversion efficiency of the solar cell.

An embodiment of the invention is made in view of this point, and aims to improve conversion efficiency of a back contact solar cell.

A first aspect of the invention is a solar cell. The solar cell includes a solar cell substrate, a p-side electrode, and an n-side electrode. The solar cell substrate has a principal surface on which a p-type surface and an n-type surface are exposed. The p-side electrode includes a first linear portion. The first linear portion is formed on the p-type surface. The first linear portion extends in a first direction. The n-side electrode includes a second linear portion. The second linear portion is formed on the n-type surface so as to extend in the first direction. The second linear portion is arranged next to the first linear portion in a second direction orthogonal to the first direction. Corners of a tip end of at least one of the first and second linear portions are formed in a round shape.

A second aspect of the invention is a method of manufacturing a solar cell. The solar cell includes: a solar cell substrate including a principal surface on which a p-type surface and an n-type surface are exposed; a p-side electrode formed on the p-type surface and including a first linear portion extending in a first direction; and an n-side electrode formed on the n-type surface so as to extend in the first direction and including a second linear portion arranged next to the first linear portion in a second direction orthogonal to the first direction, corners of a tip end of at least one of the first and second linear portions being formed in a round shape. The method includes: obtaining a linear portion whose corners of tip end are formed in a round shape from among the first and second linear portions, by forming an electroplated coating on a seed layer which is provided on the p-type or n-type surface and whose corners of tip end are formed in a round shape.

According to the aspects of the invention, conversion efficiency of a back contact solar cell can be improved.

DETAILED DESCRIPTION OF EMBODIMENTS

Figure 1:
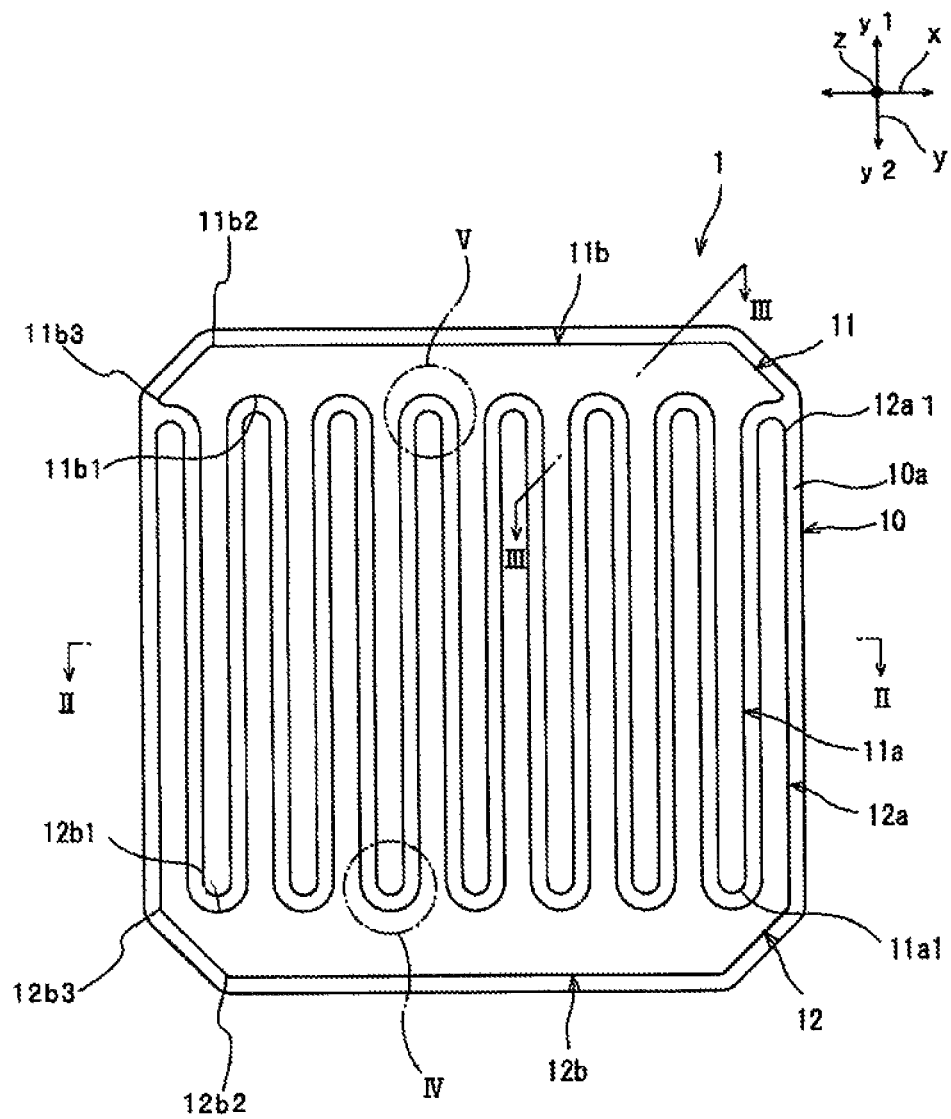
FIG. 1 is a simplified plan view of a solar cell of a first embodiment.

Hereinafter, preferred embodiments of the invention are described by using solar cell 1 shown in FIG. 1 as an example. Note, however, that solar cell 1 is only an example. The invention is not limited to solar cell 1 in any way.

In the drawings referenced in the embodiments and the like, members having substantially the same functions are assigned the same reference numerals. The drawings referenced in the embodiments and the like are schematic. Dimensional ratios and the like of objects depicted in the drawings may differ from actual dimensional ratios and the like of the objects. The dimensional ratios and the like may also differ among the drawings. Concrete dimensional ratios and the like of the objects should be determined in consideration of the following description.

Figure 2:
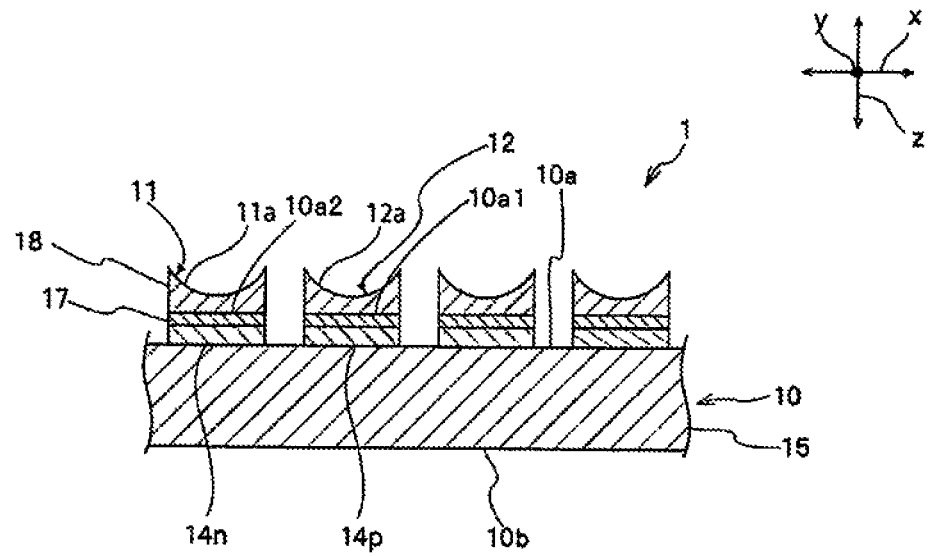
FIG. 2 is a simplified cross-section taken along a line II-II of FIG. 1.
Figure 3:
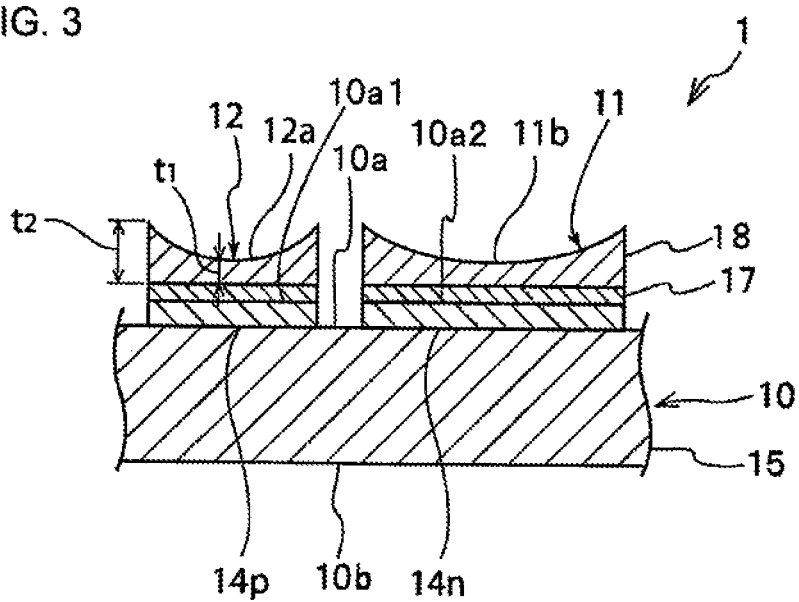
FIG. 3 is a simplified cross-section taken along a line III-III of FIG. 1.

As shown in FIGS. 1 to 3, solar cell 1 includes solar cell substrate 10. Solar cell substrate 10 has back surface 10a as a first principal surface, and light-receiving surface 10b as a second principal surface. Back surface 10a of solar cell substrate 10 includes a surface of p-type region 10a1 and a surface of n-type region 10a2.

More specifically, in the first embodiment, solar cell substrate 10 includes semiconductor substrate 15, n-type semiconductor layer 14n, and p-type semiconductor layer 14p.

Semiconductor substrate 15 generates carriers by receiving light on its principal surface on a light-receiving surface side. Here, carriers refer to holes and electrons generated when light is absorbed by semiconductor substrate 15. Semiconductor substrate 15 is formed of a crystalline semiconductor substrate of n-type or p-type conductivity. Specific examples of the crystalline semiconductor substrate include crystalline silicon substrates such as a single-crystal silicon substrate and a polycrystalline silicon substrate, for example. Hereinbelow, the first embodiment describes an example in which semiconductor substrate 15 is formed of an n-type single-crystal silicon substrate.

N-type semiconductor layer 14n and p-type semiconductor layer 14p are formed on the principal surface of semiconductor substrate 15 on a back surface side. N-type semiconductor layer 14n forms n-type region 10a2, and p-type semiconductor layer 14p forms p-type region 10a1.

Each of n-type semiconductor layer 14n and p-type semiconductor layer 14p is formed in a comb-teeth shape. N-type semiconductor layer 14n and p-type semiconductor layer 14p are formed to interdigitate each other. Thus, p-type region 10a1 and n-type region 10a2 are formed in comb-teeth shapes which are inserted between each other.

N-type semiconductor layer 14n is formed of an n-type amorphous semiconductor layer formed on the principal surface of semiconductor substrate 15 on the back surface side. Meanwhile, p-type semiconductor layer 14p is formed of a p-type amorphous semiconductor layer formed on the principal surface of semiconductor substrate 15 on the back surface side. Note that an i-type amorphous semiconductor layer may be interposed between semiconductor substrate 15 and n-type amorphous semiconductor layer 14n, as well as between semiconductor substrate 15 and p-type amorphous semiconductor layer 14p. In this case, the i-type amorphous semiconductor layer may be formed of an i-type hydrogenated amorphous silicon layer having a thickness which virtually does not contribute to power generation, for example.

The p-type amorphous semiconductor layer is a semiconductor layer of p-type conductivity, to which a p-type dopant is added. Specifically, in the first embodiment, the p-type amorphous semiconductor layer is made of a p-type hydrogenated amorphous silicon. Meanwhile, the n-type amorphous semiconductor layer is a semiconductor layer of n-type conductivity, to which an n-type dopant is added. Specifically, in the first embodiment, the n-type amorphous semiconductor layer is made of an n-type hydrogenated amorphous silicon. Note that although the thickness of each of the p-type and n-type amorphous semiconductor layers is not particularly limited, it may be about 20 angstroms to 500 angstroms, for example.

N-side electrode 11 collecting electrons and p-side electrode 12 collecting holes are formed on back surface 10a of solar cell substrate 10. N-side electrode 11 is formed on a surface of n-type semiconductor layer 14n. To be specific, n-side electrode 11 is formed on an n-type surface of n-type region 10a2. N-side electrode 11 includes fingers 11a as linear portions and bus bar 11b. Each of fingers 11a linearly extends in a first direction y. Fingers 11a are arranged in parallel at certain intervals in a second direction x orthogonal to the first direction y. Bus bar 11b is arranged on one end side (y1 side) of fingers 11a. Bus bar 11b is formed to extend in the direction x. A y1-side end of each of fingers 11a is connected to bus bar 11b.

P-side electrode 12 is formed on p-type semiconductor layer 14p. To be specific, p-side electrode 12 is formed on a p-type surface of p-type region 10a1. P-side electrode 12 includes fingers 12a as linear portions and bus bar 12b. Each of fingers 12a linearly extends in the direction y. Fingers 12a and the aforementioned fingers 11a are arranged alternately at certain intervals in the direction x. In other words, finger 12a is arranged next to finger 11a in the direction x. Bus bar 12b is arranged on the other end side (y2 side) of fingers 12a. Bus bar 12b is formed to linearly extend in the direction x. A y2-side end of each of fingers 12a is connected to bus bar 12b. In addition, bus bar 12b faces tip ends 11a1 of fingers 11a in the direction y, whereas bus bar 11b faces tip ends 12a1 of fingers 12a in the direction y.

Figure 4:
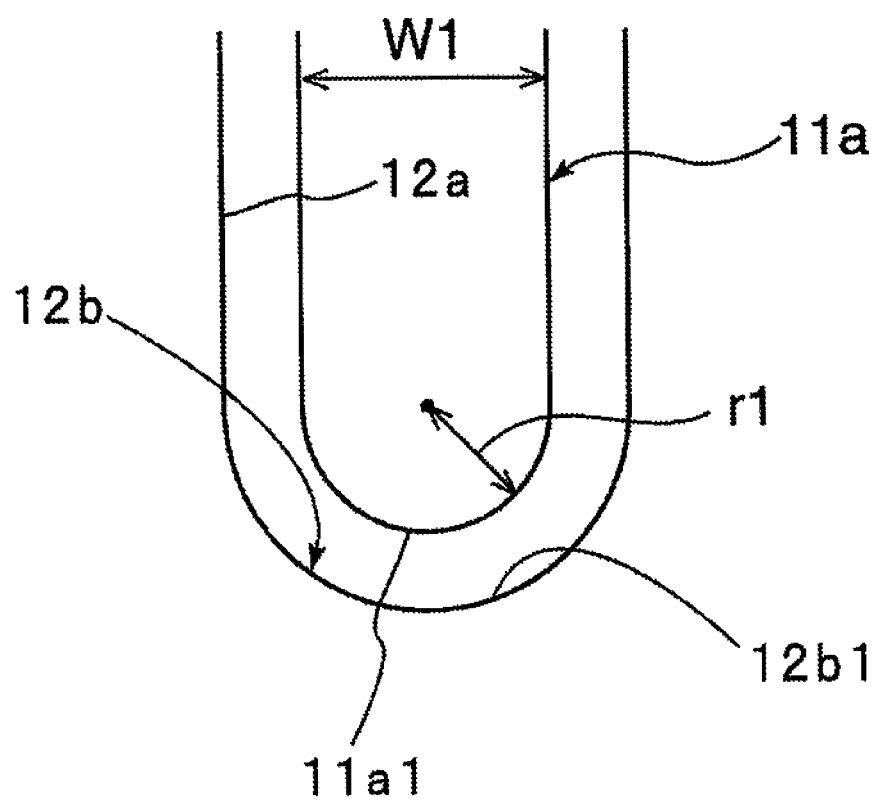
FIG. 4 is an enlarged simplified plan view of a portion IV of FIG. 1.
Figure 5:
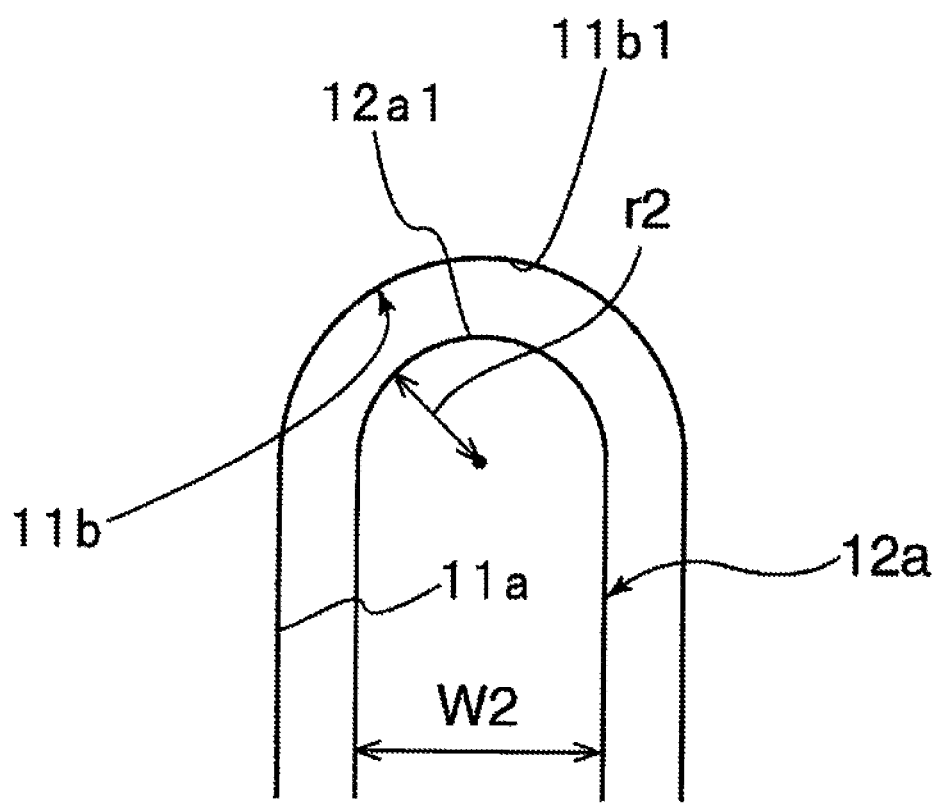
FIG. 5 is an enlarged simplified plan view of a portion V of FIG. 1.

In the first embodiment, corners of at least one of tip ends 11a1 of fingers 11a and tip ends 12a1 of fingers 12a are formed in a chamfered shape, or more preferably, in a round shape. Specifically, the corners of both tip ends 11a1, 12a1 of fingers 11a, 12a are formed in a chamfered shape, or more preferably in a round shape. To be more precise, as shown in FIGS. 4 and 5, radiuses of curvature r1, r2 of corners of both tip ends 11a1, 12a1 of fingers 11a, 12a are set to be ½ of widths W1, W2 of fingers 11a, 12a. Accordingly, both tip ends 11a1, 12a1 of fingers 11a, 12a are formed in a semicircular shape.

Moreover, each of corners formed in connection portions between bus bars 11b, 12b and fingers 11a, 12a is formed in a chamfered shape, i.e., a shape in which sides are not orthogonal to each other, or more preferably, formed in a round shape. Specifically, portions 11b1, 12b1 of bus bar 11b, 12b facing tip ends 12a1, 11a1 of fingers 12a, 11a are formed in shapes corresponding to the shapes of tip ends 11a1, 12a1 of fingers 11a, 12a, i.e., in a semicircular shape.

Furthermore, other corners 11b2, 12b2, 11b3, 12b3 of bus bar 11b, 12b shown in FIG. 1 are also formed in a round shape. That is, in the first embodiment, all corners of n-side electrode 11 and p-side electrode 12 are formed in a round shape.

Next, a method of manufacturing solar cell 1 is described.

First, solar cell substrate 10 is prepared. The method of manufacturing solar cell substrate 10 is not particularly limited, and solar cell 10 may be formed according to a known method, for example. To be specific, solar cell substrate 10 can be manufactured by forming n-type semiconductor layer 14n and p-type semiconductor layer 14p on semiconductor substrate 15 according to a CVD (Chemical Vapor Deposition) method, for example. Note that although patterns of n-type semiconductor layer 14n and p-type semiconductor layer 14p are not particularly limited, it is preferable that n-type semiconductor layer 14n and p-type semiconductor layer 14p have patterns in which corners of tip ends are formed in a round shape in correspondence with the patterns of n-side electrode 11 and p-side electrode 12. With this configuration, carriers can be collected efficiently from n-type semiconductor layer 14n and p-type semiconductor layer 14p to n-side electrode 11 or p-side electrode 12.

Next, as shown in FIGS. 2 and 3, n-side electrode 11 and p-side electrode 12 are formed. At first, seed layer 17 having the same flat shape as n-side electrode 11 and p-side electrode 12 of the aforementioned shapes is formed on n-type semiconductor layer 14n and p-type semiconductor layer 14p. In other words, formed is a seed layer 17 whose corners including those at the tip ends are formed in a round shape.

Seed layer 17 is not particularly limited as long as plating can be performed thereon. Seed layer 17 preferably has a surface layer made of Cu, Sn and the like. To be specific, it is preferable that seed layer 17 is formed of a multilayer including a TCO (Transparent Conductive Oxide) layer formed of a conductive oxide such as indium oxide, and a metal layer made of metal such as Cu, Sn and the like or an alloy containing one or more of these types of metal. The method of forming seed layer 17 is not particularly limited. Seed layer 17 may be formed by a CVD method, a sputtering method, or a deposition method, for example. The thickness of seed layer 17 is not particularly limited. The thickness of seed layer 17 may be about 100 nm to 500 nm, for example.

Next, electroplated coating 18 made of Cu, Sn and the like is formed by an electroplating method, for example, on seed layer 17. Thus, n-side electrode 11 and p-side electrode 12 formed of a multilayer including seed layer 17 and electroplated coating 18 can be formed.

The thickness of the electroplated coating formed by the electroplating method is correlated to the field intensity applied at the time of performing the electroplating. The higher the field intensity applied to the part to be electroplated, the thicker electroplated coating 18 becomes. For this reason, if the applied field intensity differs among portions within the part to be electroplated, the thickness varies within the electroplated coating. Specifically, the electroplated coating at a portion to which high field intensity is applied becomes thicker than the electroplated coating at a portion to which low field intensity is applied.

Figure 6:
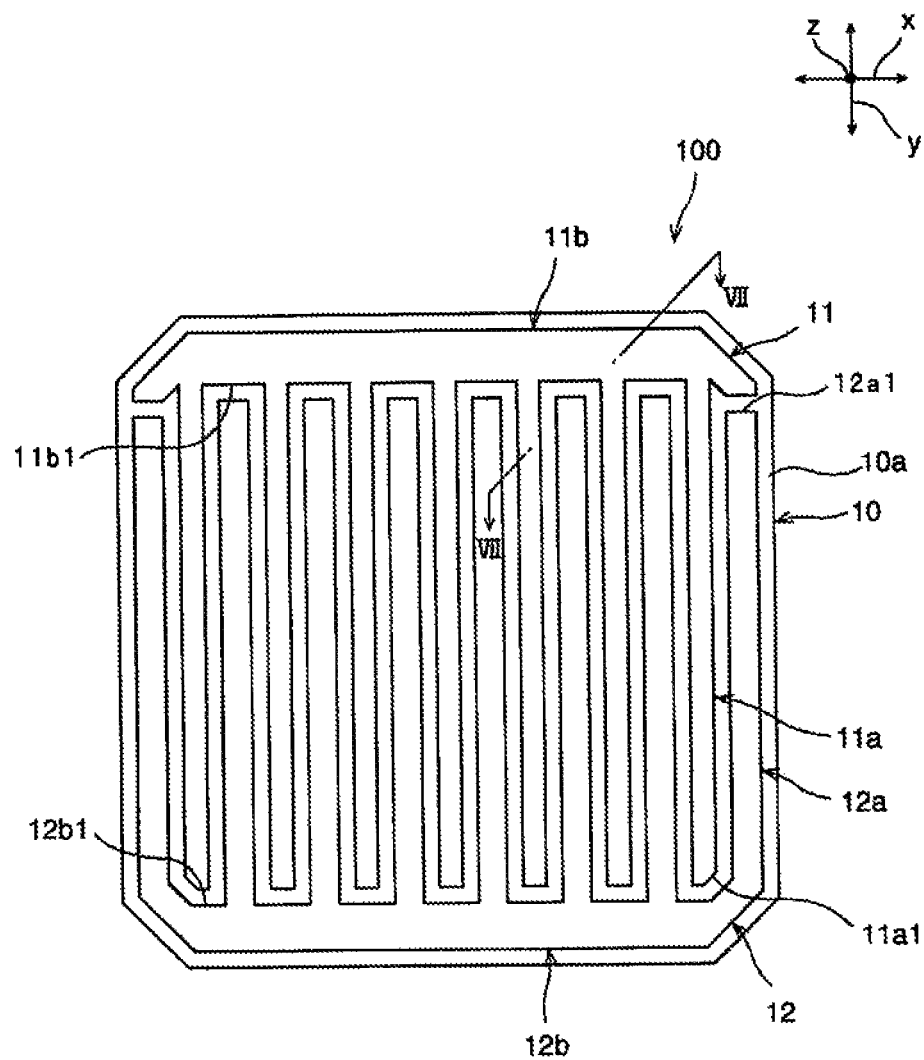
FIG. 6 is a simplified plan view of a solar cell of a comparative example. In the comparative example shown in FIG. 6, members having functions substantially common to the first embodiment are assigned common reference numerals.
Figure 7:
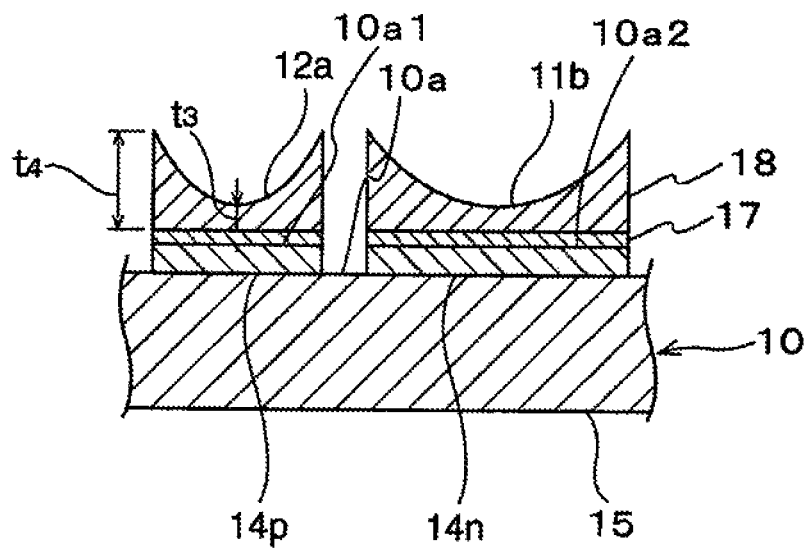
FIG. 7 is an enlarged simplified plan view of a portion taken along a line VII-VII of FIG. 6.

Here, assume a case as in solar cell 100 of a comparative example shown in FIG. 6 where corners of n-side electrode 11 and p-side electrode 12 are not formed in a round shape but are sharp, for example. In this case, lines of electric force concentrate in the corners of n-side electrode 11 and the corners of p-side electrode 12, and an electric field of high field intensity is applied thereto. As a result, as shown in FIG. 7, a ratio ($t_4/t_3$) of thickness $t_4$ at peripheral portions of n-side electrode 11 and p-side electrode 12 to thickness $t_3$ at center portions thereof becomes extremely large. Accordingly, the peripheral portions of n-side electrode 11 and p-side electrode 12 are formed to project sharply, and their strengths are lowered. Hence, at least one of tip end 11a1 of finger 11a and tip end 12a1 of finger 12a is deformed, so that finger 11a and finger 12a may come into contact with each other and cause a short circuit. Occurrence of a short circuit between finger 11a and finger 12a lowers conversion efficiency of solar cell 100.

By enlarging the distance between n-side electrode 11 and p-side electrode 12, it is possible to avoid the short circuit between finger 11a and finger 12a. However, in this case, holes being minority carriers are likely to recombine and disappear before reaching p-side electrode 12. Thus, conversion efficiency of the solar cell is lowered.

On the other hand, in the first embodiment, tip ends 11a1, 12a1 of fingers 11a, 12a are formed in a round shape. With this, it is possible to avoid concentration of lines of electric force to peripheral portions of tip ends 11a1, 12a1. Consequently, as shown in FIG. 3, the difference in thicknesses of center portions of tip ends 11a1, 12a1 and the peripheral portions thereof can be reduced. More specifically, a ratio ($t_2/t_1$) of thickness $t_1$ at the center portions of tip ends 11a1, 12a1 to thickness $t_2$ at the peripheral portions thereof can be reduced. Moreover, in the first embodiment, corners at the connection portions between fingers 11a, 12a and bus bars 11b, 12b are also formed in a round shape. Hence, the thicknesses at peripheral portions of the corners at the connection portions between fingers 11a, 12a and bus bars 11b, 12b can also be reduced. Particularly in the first embodiment, tip ends 11a1, 12a1 of fingers 11a, 12a are formed in a semicircular shape and portions 11b1, 12b1 of bus bars 11b, 12b facing tip ends 12a1, 11a1 of fingers 12a, 11a are formed in a semicircular shape. With this, the thicknesses at peripheral portions of tip ends 11a1, 12a1 and portions 11b1, 12b1 can be reduced. As a result, conversion efficiency of solar cell 1 is less likely to be lowered due to occurrence of a short circuit between n-side electrode 11 and p-side electrode 12 attributable to deformation of the peripheral portions of n-side electrode 11 and p-side electrode 12. Accordingly, the space between fingers 11a and fingers 12a can also be reduced. Hence, it is possible to avoid recombination and disappearance of holes being minority carriers, whereby high conversion efficiency can be achieved.

In addition, since it is possible to reduce the thicknesses of the peripheral portions of n-side electrode 11 and p-side electrode 12, it is possible to avoid a poor appearance where a color tone at the peripheral portions differ from that at the center portions.

Moreover, variation in electrical resistivity of n-side electrode 11 and p-side electrode 12 can be reduced. Hence, it is possible to avoid concentration of electric fields of n-side electrode 11 and p-side electrode 12 in a specific part at the time of power generation.

Note that the effects described above are those achievable when the corners of tip ends 11a1, 12a1 and of portions 11b1, 12b1 are formed in a round shape. Note that in order to obtain a more preferable effect, radiuses of curvature of the corners of tip ends 11a1, 12a1 and of portions 11b1, 12b1 are preferably within a range of 1 to ½ of widths of fingers 11a, 12a, or more preferably within a range of ¾ to ½ thereof. Additionally, radiuses of curvature of the corners of tip ends 11a1, 12a1 and of portions 11b1, 12b1 are preferably set such that a ratio of the thickness of electroplated coating 18 at the center portion to the thickness of the electroplated coating at the peripheral portion is 1.2 or smaller, or more preferably set such that the ratio is 1 or smaller.

Hereinafter, a description is given of other examples of preferred embodiments of the invention. Note that in the following description of the embodiments, members having functions substantially common to the first embodiment are referred to as having the common function, and descriptions thereof are omitted.

(Second Embodiment)

Figure 8:
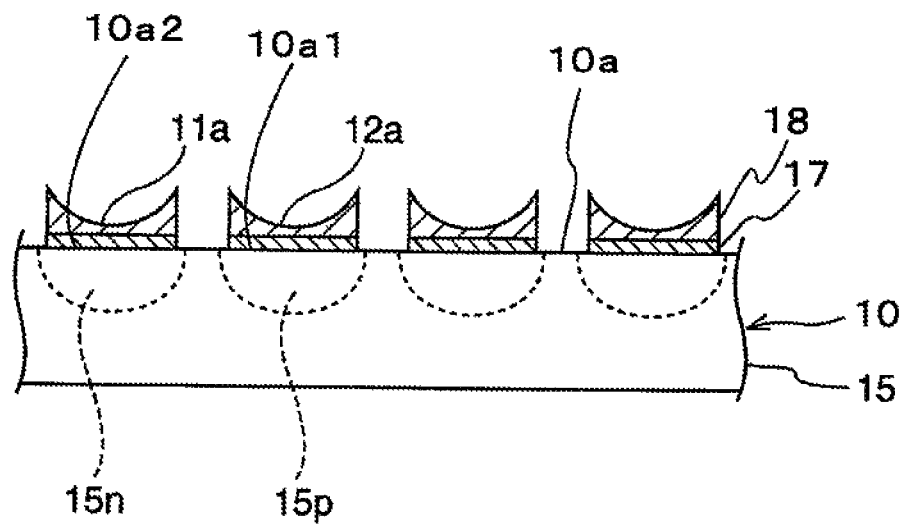
FIG. 8 is a simplified cross-section of a solar cell of a second embodiment.

FIG. 8 is a simplified cross-section of a solar cell of a second embodiment.

The first embodiment describes an example in which solar cell substrate 10 is formed of semiconductor substrate 15, n-type semiconductor layer 14n, and p-type semiconductor layer 14p. However, the invention is not limited to this configuration. For example, as shown in FIG. 8, solar cell substrate 10 maybe formed of an n-type crystalline semiconductor substrate 15 including a first principal surface in which $n^+$ type thermal diffusion area 15n and p-type thermal diffusion area 15p are formed. An n-type dopant is thermally diffused in n+ type thermal diffusion area 15n, and a p-type dopant is thermally diffused in p-type thermal diffusion area 15p.

(Third Embodiment)

Figure 9:
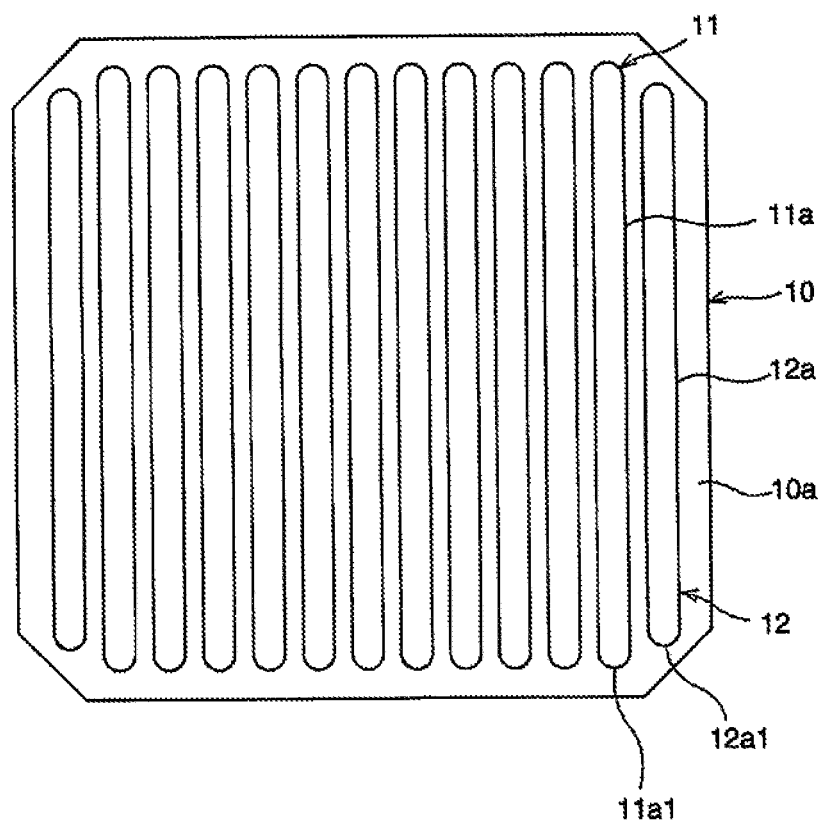
FIG. 9 is a simplified plan view of a solar cell of a third embodiment.

FIG. 9 is a simplified plan view of a solar cell of a third embodiment.

The first embodiment describes an example in which n-side electrode 11 and p-side electrode 12 are respectively formed of fingers 11*a*, 12*a* and bus bars 11*b*, 12*b*. However, the invention is not limited to this configuration. For example, as shown in FIG. 9, n-side electrode 11 and p-side electrode 12 may respectively be formed of fingers 11*a*. 12*a* with no bus bar provided thereto.

(Other Modified Example)

The first embodiment describes a case where all corners of n-side electrode 11 and p-side electrode 12 are formed in a round shape. However, the invention is not limited to this configuration. For example, a configuration may be employed in which only corners of tip ends 11*a*1, 12*a*1 of fingers 11*a*, 12*a* are formed in a chamfered shape.

What is claimed is:

1. A method of manufacturing a solar cell including: a solar cell substrate including a p-type surface and an n-type surface formed on a principal surface side of the solar cell substrate; a p-side electrode formed on the p-type surface and including a first linear portion linearly extending in a first direction; and an n-side electrode formed on the n-type surface and including a second linear portion linearly extending in the first direction and arranged next to the first linear portion in a second direction orthogonal to the first direction, corners of a tip end of at least one of the first and second linear portions being formed in a round shape, the method comprising:

forming a p-type surface and an n-type surface on a principal surface of a solar cell substrate such that the p-type surface and the n-type surface extends in a linear shape in a first direction and corners of tip ends of the p-type and n-type surfaces are formed in a round shape;

forming a seed layer on the a p-type or n-type surface such that corners of a tip end of the seed layer are formed in a round shape; and forming a plating on the seed layer, thereby forming a p-side and n-side electrode.

2. A method of manufacturing a solar cell comprises:

forming a seed layer on a p-type or n-type surface of a solar cell substrate such that corners of a tip end of the seed layer are formed in a round shape; and forming an electroplated coating on the seed layer, thereby forming an electrode on the-type or n-type surface whose tip end has corners formed in a round shape.

3. The method of manufacturing a solar cell according to claim 2, wherein the electroplated coating is formed by electroplating.

4. The method of manufacturing a solar cell according to claim 3, further comprises:

forming a p-type amorphous semiconductor layer and an n-type amorphous semiconductor layer on a principal surface side of the solar cell substrate, wherein the seed layer is formed on the p-type amorphous semiconductor layer and the n-type amorphous semiconductor layer.

5. The method of manufacturing a solar cell according to claim 4, further comprises:

forming an i-type amorphous semiconductor layer on a principal surface side of the solar cell substrate, wherein at least one of the p-type amorphous semiconductor layer and the n-type amorphous semiconductor layer is formed on the i-type amorphous semiconductor layer.

* * * * *